United States Patent [19]

Erickson

[11] Patent Number: 5,006,812
[45] Date of Patent: Apr. 9, 1991

[54] POWER AMPLIFIER WITH BUILT-IN TEST CIRCUIT

[75] Inventor: Alan R. Erickson, Cedar Rapids, Iowa

[73] Assignee: Rockwell International Corporation, El Segundo, Calif.

[21] Appl. No.: 388,180

[22] Filed: Aug. 1, 1989

[51] Int. Cl.⁵ .......................................... G01R 35/00
[52] U.S. Cl. ............................................ 330/2; 330/51
[58] Field of Search ................. 330/2, 51, 278, 279, 330/284, 291, 294; 455/115, 126

[56] References Cited

U.S. PATENT DOCUMENTS

| | | | |
|---|---|---|---|
| 2,121,434 | 6/1938 | Klinedinst et al. | 331/59 |
| 2,244,751 | 6/1941 | Werrmann | 331/59 |
| 2,585,019 | 2/1952 | LaLande | 331/59 |
| 2,587,697 | 3/1952 | Conrad | 331/59 |
| 2,837,636 | 6/1958 | Richard, Jr. | 331/59 |
| 2,999,928 | 9/1961 | Haydon et al. | 331/59 |
| 3,193,777 | 7/1965 | Carter et al. | 331/59 |
| 3,667,067 | 5/1972 | Levell | 331/59 |
| 3,958,244 | 5/1976 | Lee et al. | 455/115 X |
| 4,056,787 | 11/1977 | Saitoh et al. | 331/59 |
| 4,190,808 | 2/1980 | Fajen | 331/59 |
| 4,476,437 | 10/1984 | Fujiwara | 330/2 |
| 4,709,403 | 11/1987 | Kikuchi | 330/284 X |

Primary Examiner—Steven Mottola
Attorney, Agent, or Firm—John J. Horn; M. Lee Murrah; H. Fredrick Hamann

[57] ABSTRACT

A test circuit for use in testing amplifiers in order to check that they are functioning properly at operational power levels. The test circuit includes switching mechanisms which configure the amplifier in feedback mode in order to cause the amplifier to oscillate and a circuitry for measuring the power output of the amplifier during oscillation in order to thereby check that it is properly operational. The circuit may also include a load acting as a fixed attenuator for dissipating the power output of the amplifier and a bandpass filter for selecting an appropriate frequency of oscillation for the amplifier. The circuit may also include a control loop for regulating the amount of feedback and controlling the output power level.

18 Claims, 3 Drawing Sheets

POWER AMPLIFIER WITH BUILT-IN TEST CIRCUIT

The Government has rights in this invention pursuant to Contract No. F19628-87-C-0163 awarded by the U.S. Air Force.

BACKGROUND OF INVENTION

The present invention relates to the testing of electronic components, and more particularly, to the test circuitry required for properly verifying the operation of power amplifiers.

It is frequently desirable for electronic components used in applications where reliability is important, to have built-in test functions for verifying that the equipment is operating properly. As a part of these test functions, it is often required that power amplifiers, such as amplifiers used to boost the power of RF signals prior to their delivery to transmitting antennas, include the necessary test circuitry for checking that they are properly operational. While it is sometimes adequate to monitor signal levels during normal operation, some applications require testing independent of or prior to application of normal signal levels. Ordinarily power amplifiers are independently tested by having a special test signal generated by separate test circuitry applied to the input of the amplifier and by then measuring the output of the amplifier, again using separate test circuitry in order to check the response of the amplifier to the test signal. However, this type of test circuit construction requires test signal generating and amplifier output signal measuring capabilities independent of the amplifier itself which are expensive to build into the amplifier system, add significantly to the bulk of the amplifier's electronic package and are subject to many types of operational faults which may provide false indications of amplifier defects. Furthermore, it is difficult to provide separate test circuitry which generates test signals at high power levels and the test functions for power amplifiers are frequently conducted at power levels substantially below the levels characteristic of their actual operation which limits the validity of the test procedure.

It is therefore an object of the present invention to provide a test circuit for verifying the independent operation of an amplifier which requires a minimum amount of separate test circuitry and therefore, reduces the bulk of the electronics package associated with the amplifier.

It is another object of the present invention to provide a test circuit for verifying the operation of a power amplifier which tests the operation of the amplifier at power levels characteristic of the operational power levels of the amplifier.

It is a further object of the present invention to provide a test circuit for an amplifier having increased reliability and providing fewer false indications of defects in the actual amplifier itself.

SUMMARY OF THE INVENTION

The present invention constitutes a test circuit built in to a power amplifier for use in checking the operation of the amplifier and verifying that it is meeting predetermined performance criteria. The test circuit includes a set of relays for switching the amplifier into a feedback mode and directing the output of the power amplifier along a feedback path by which it is returned as input to the amplifier. The test circuit also includes a load for attenuating the output of the amplifier as it is fed back as input and helping to dissipate the power generated by the amplifier and a mechanism for checking the power level output of the amplifier and comparing it to a threshold value. When broadband amplifiers are being tested, the test circuit may also include a bandpass filter for filtering the feedback returned to the input of the amplifier so as to limit the operation of the device to a characteristic frequency. In operation, the amplifier begins to oscillate as its output is fed back to its input and its power output quickly rises to substantial levels. Once the power level of the amplifier stabilizes, it is compared to the required threshold level to provide an indication of the performance of the amplifier. If the power output of the amplifier does not reach its required threshold level, a fault indication is provided to the system operator showing that the amplifier is defective.

In the preferred embodiment, the test circuit includes an automatic gain control loop which regulates the amount of feedback provided to the amplifier by way of the feedback path from the output to the input of the amplifier. The amount of feedback is carefully controlled to stabilize the power level at which the amplifier oscillates at "peak" power levels (approaching the maximum power required during normal operations but nevertheless below the levels at which significant gain compression occurs). This type of gain control loop may utilize an error amplifier which compares an analog of the RF power output of the power amplifier with a reference signal in order to generate an error signal which may then be used as a gain control signal to regulate a variable attenuator acting on the input to the power amplifier. The level of a control signal, such as the error signal provided to a variable attenuator referred to above, may be checked against predetermined thresholds to verify the performance of the power amplifier. A measure may thereby be achieved of the gain of the power amplifier in accordance with a characteristic power output level which provides a more precise indication of the level of performance of the power amplifier.

DESCRIPTION OF THE PREFERRED EMBODIMENT

Figure 1:
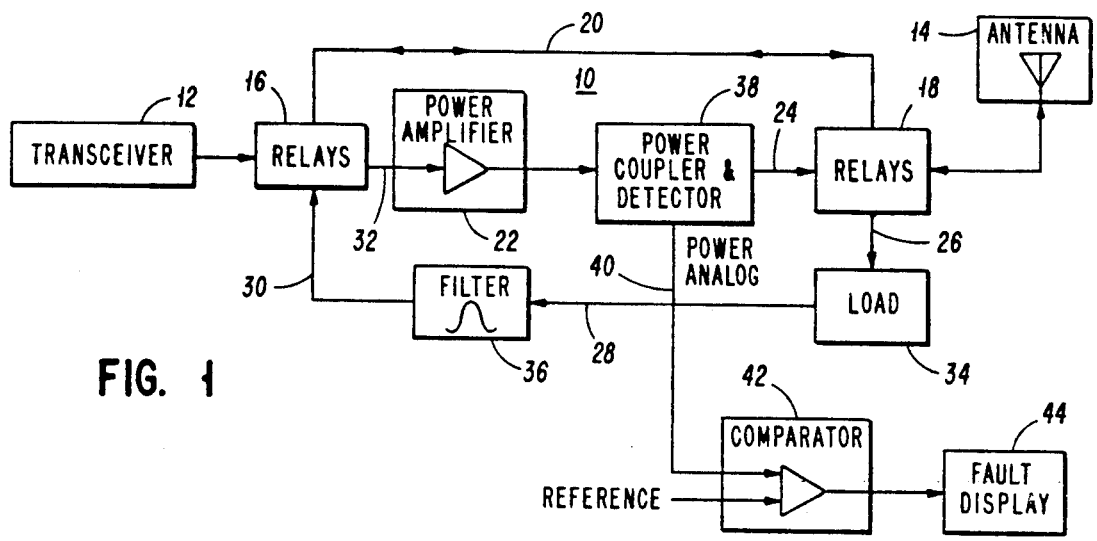
FIG. 1 is a block diagram of a power amplifier system for use with a transceiver in which a test circuit in accordance with the present invention has been incorporated into the amplification system.

Referring now to FIG. 1, the power amplification system 10 receives modulated signals at low power levels over a broad frequency range from the transceiver 12, substantially amplifies the power of these signals and delivers the amplified signals to the antenna 14 from where the energy represented by the signals may be radiated into free space as electromagnetic waves. It should also be noted that the system 10 may accommodate the receipt of signals from the antenna 14 and their transfer to the transceiver 12 through the action of the relays 16 and 18 which can operate to shunt signals from the antenna 14 unto the line 20 from where they can proceed to the transceiver 12.

However, the relays 16 and 18 can also operate to switch the amplification system 10 into a feedback mode in which the output of the power amplifier 22 is directed along the lines 24, 26, 28, 30, and 32 by way of the load 34 and filter 36 back to the power amplifier 22 as input. In the feedback mode, the power amplifier 22 oscillates at a frequency and power level determined by the load 34, filter 36 and the characteristics of the power amplifier 22 itself. More specifically, the power output of the power amplifier 22 increases until sufficient gain compression occurs due to saturation affects so as to offset the overall gain of the system 10.

The load 34 and filter 36 play important roles in controlling the operation of the amplification system 10 when it is in feedback mode. The load 34 acts as a fixed attenuator and dissipates excess power generated by the amplifier 22 which might otherwise overload the other system components. The filter 36 regulates the frequency at which the system oscillates to select a test frequency representative of the actual operational frequencies of the transceiver 12. The mere presence of an oscillation is important since it indicates that the amplifier has a certain minimum amount of gain to overcome the circuit losses determined primarily by load 34 and filter 36.

It is important to note that the necessary condition for oscillation is unity gain and zero phase difference around the RF loop. The length of the feedback path is adjusted for zero phase difference between the amplifier signal and the feedback signal. The amplitude peak of filter 36 is selected to correspond to the desired test frequency. The attenuation of the load 34 is adjusted to correspond to the minimum required gain of the amplifier. The system will not begin oscillation if the amplifier has less than this minimum gain and therefore will fail the test when the amplifier is unable to provide sufficient gain. Oscillations will be sustained at the particular power level where saturation effects cause gain compression sufficient to create unity loop gain. The power level of this occurrence is measured as a criteria of system performance.

During oscillation, the performance of the system may be monitored through the action of the power coupler and detector 38 which samples the power output of the amplifier 22 on the line 24 and provides a power analog type signal on the line 40 to the comparator 42. The comparator 42 compares the level of the power analog signal to a reference level and determines whether the power output of the amplifier 22 meets a threshold requirement indicative of adequate performance by the system 10 and amplifier 22. If the power output of the power amplifier 22 is not satisfactory, as indicated by the comparator 42, the fault display 44 is activated to give the operator of the transceiver 12 an indication that the power amplifier 22 is defective. It should be noted that when operated in the feedback mode the control of the power amplification system 10 is of open loop type since the amount of feedback to the amplifier 22 is not actively controlled.

Figure 2:
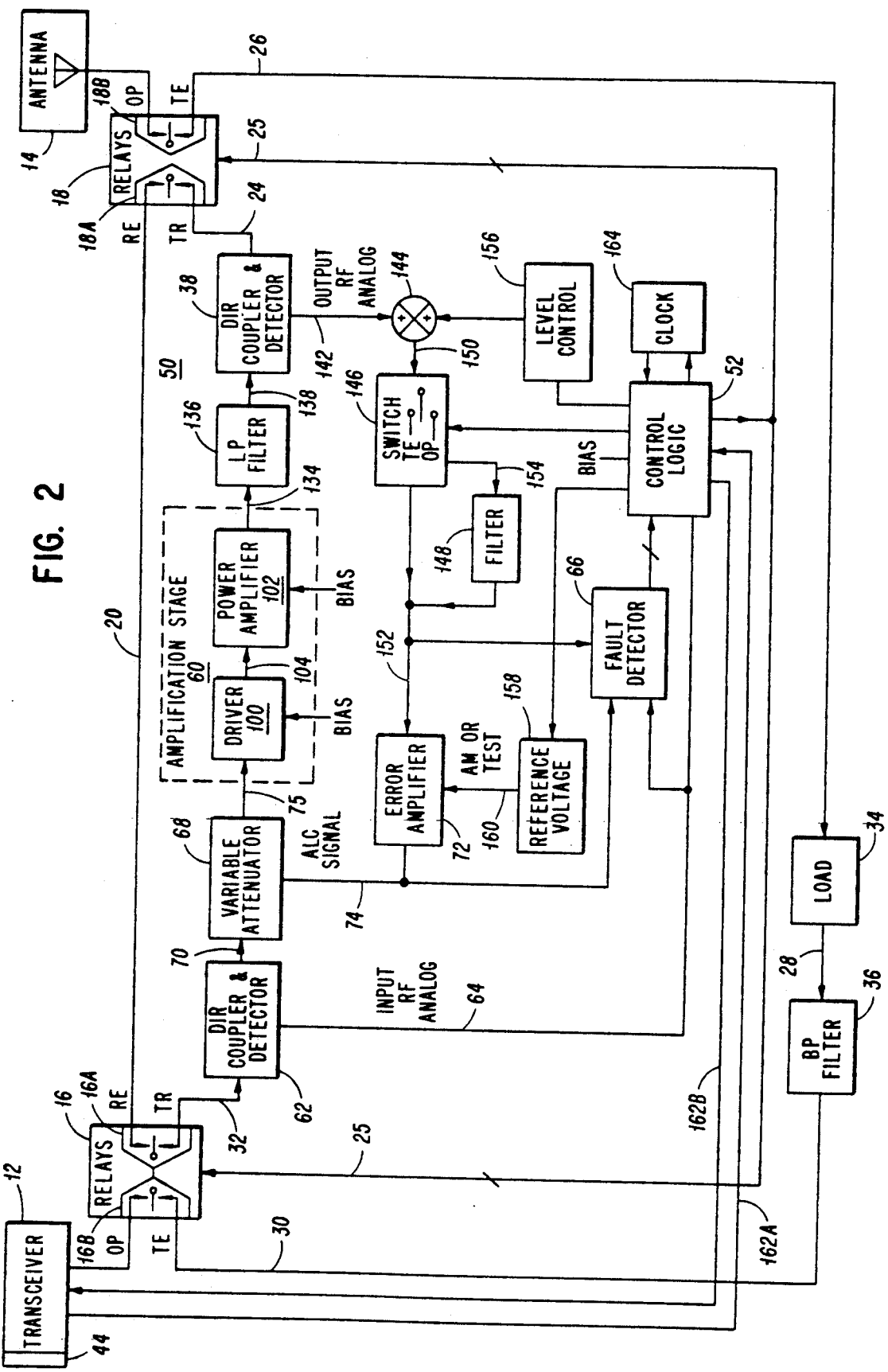
FIG. 2 provides a block diagram of a power amplifier system having an automatic gain control loop in which a test circuit in accordance with the present invention has been incorporated into the amplifier system.

Referring now to FIG. 2, the preferred embodiment of the present invention is shown in the form of an amplification system 50 connected between the transceiver 12 and the antenna 14 for amplifying the power of modulated signals supplied by the transceiver and delivering the amplified signals to the antenna 14 so that they can be radiated as electromagnetic energy. The amplification system 50 is basically similar to the system 10 previously described with respect to FIG. 1, in that a power amplifier may be configured in a feedback mode and thereby induced to oscillate for testing purposes. However, the amplification system 50 also employs an additional automatic gain control loop for carefully regulating the output power level of the amplifier at operational levels as will be hereinafter described.

The relays 16 and 18 include two sets of switches, namely transmit/receive switches 16A and 18A and self-test switches 16B and 18B. The switches 16B and 18B are engaged in the OP position for regular operations, but are engaged on the TE positions for self-test operations. The switches 16A and 18A are engaged in the RE positions to allow for the transmission of signals from the antenna 14 to the transceiver 12 during regular receive operations, but are engaged in the TR positions to allow for the processing of signals by the power amplification system 50 both during regular transmit operations for which signals are supplied by the transceiver 12 and during testing operations in which the system 50 is configured for feedback.

During testing operations, the relays 16 and 18 are controlled by signals on lines 25 from the control logic 52 and the switches 16A and 18A are engaged in the TR positions and the switches 16B and 18B are engaged in the TE positions so that the output from the amplification stage 60 present on line 24 may be returned as input to the amplification stage 60 present on line 32, via the lines 26, 28 and 30, as well as the load 34 and bandpass filter 36 and the relays 16 and 18 previously referred to. The load 34 is operative for dissipating the power output of the amplification stage 60 and avoiding overload and burnout of the other circuit components during testing operations. The load 34 may comprise a simple PI resistive network having a moderate amount of attenuation, such as −8 dB, and mounted on a suitable heat sink. The bandpass filter 36 is a two pole top capacitively coupled filter having a 3 dB bandwidth of approximately 10 MHz when centered at an operational frequency of approximately 234 MHz and having −3 dB of minimum insertion loss.

The input intended for the amplification stage 60, supplied on line 32, is first passed through the directional coupler and detector 62 which samples the RF level of the input signal and provides a voltage analog of its RF power level on the line 64 to the control logic 52. The directional coupler and detector 62 comprise a directional coupler which taps off a very limited amount of energy from the forward power flow presented to the coupler input while causing a minimum amount of perturbation to the main line signal and a diode which converts the RF energy to an analog voltage corresponding to the power level of the signal. The input signal intended for the amplification stage 60 is then directed over the line 70 to the voltage variable attenuator 68, which attenuates this signal to varying degrees (−1 dB to −25 dB) in accordance with the level of the ALC (Automatic Level Control) signal supplied from the error amplifier 72 on the line 74. The ALC signal effectively controls the level of input to the amplification stage 60.

Figure 3:
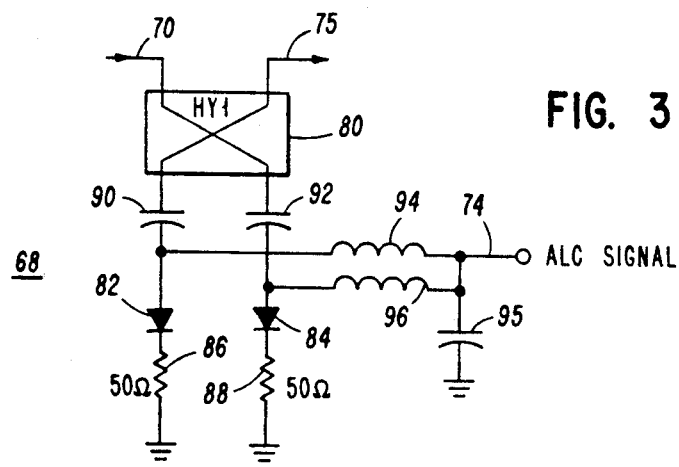
FIG. 3 provides a schematic diagram of the variable attenuator component of the power amplifier system shown in FIG. 2.

FIG. 3 shows the voltage variable attenuator 68 in greater detail as including a quadrature stripline coupler 80 and a pair of PIN diodes 82 and 84 in series with two termination resistors 86 and 88 both of which are connected to ground. The signal from the directional coupler and detector 62 is supplied on the line 70 to the input port of the coupler 80 while output of the coupler 80 is supplied from its isolation port on the line 75 to the amplification stage 60. The anodes of the pin diodes 82 and 84 are separately connected to the output ports of the coupler 80 through DC isolation capacitors 90 and 92 and are also connected to the line 74 for receipt of the ALC control signal through RF chokes 94 and 96. The by-pass capacitor 95 allows the passage of residual RF to ground but isolates the DC control signal from ground.

In operation, the PIN diodes 82 and 84 provide resistance in inverse proportion to the DC current flow passing through them which is regulated by the ALC signal level. As the total termination resistance presented at the output ports of the coupler 80 changes, the amount of RF energy reflected to the isolation port varies in accordance with the resulting impedance mismatch. The ALC signal from the error amplifier 72 thereby controls the attenuation provided by the attenuator 68 with more of the energy of the input signal intended for the amplification stage 60 being dissipated by the termination resistors 86 and 84 as the ALC signal level increases.

Referring again back to FIG. 2, the output of the variable attenuator 68 is supplied on the line 75 as direct input to the amplification stage 60. The amplification stage 60 includes a driver 100 and a power amplifier 102 which both amplify the power level of the signal received from the variable attenuator 68. The driver 100 includes a pair of transistors in common emitter configuration biased for class A-B operation which are interfaced to the attenuator 68 and amplifier 102 through quadrature hybrid couplers which split and re-combine the input to and output from the driver 100. The power amplifier 102 receives the output of the driver 100 on the line 104 and employs a number of transistors in amplifying the power of the received signal to the required final output level.

Figure 4:
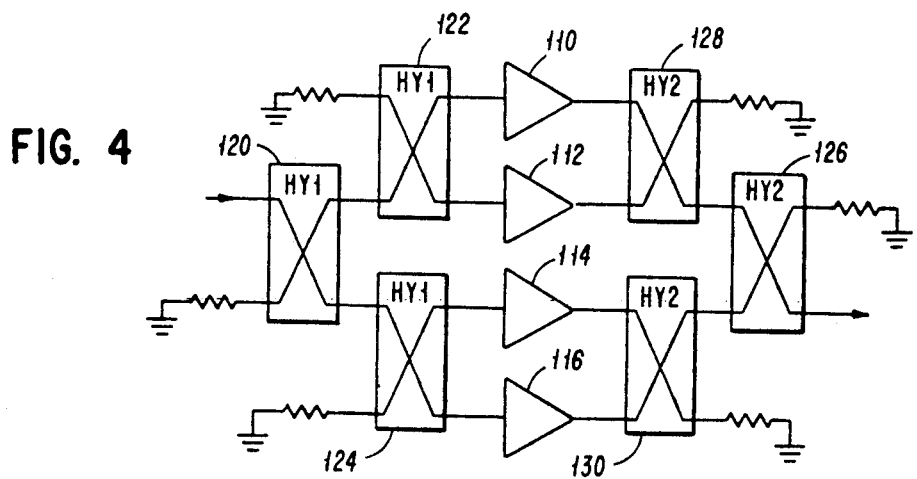
FIG. 4 provides a schematic diagram of the power amplifier within the amplification stage of the power amplifier system shown in FIG. 2.

FIG. 4 shows the power amplifier 102 in greater detail. The power amplifier 102 includes four transistor pairs, 110, 112, 114 and 116, arranged for combined operations through the action of the hybrid couplers, 120, 122, 124, 126, 128 and 130. The hybrid couplers 120, 122, and 124 comprise 90° quadrature stripline couplers connected for splitting the input signal received from the driver 100 into four approximately equal energy parts which are provided to each of the transistor pairs 110, 112, 114 and 116. The hybrid couplers 126, 128 and 130 comprise 90° quadrature stripline couplers connected for combining the outputs of the transistor pairs 110, 112, 114 and 116 into a single signal of substantially increased power. Each of the transistor pairs 110, 112, 114 and 116 are connected in a common emitter configuration biased for class A-B operations. Input coupling and matching to and from each of the transistor pairs 110, 112, 114 and 116 may be accomplished using transmission line networks constructed and arranged so as to allow the individual transistors in each pair to be driven 180° out of phase so that each is active for only one-half of the cycle (i.e., push-pull configuration). The amplification stage 60 is adapted for amplifying signals in the range of 225-400 MHz with 13-16 dB of minimum gain.

It should be noted that the use of multiple numbers of transistor pairs is dictated by the power requirements of the system since each transistor pair can only handle a power output requirement of approximately 100 watts. In order to achieve power outputs on the order of 400 watts as desired in the present case, four transistor pairs must be employed and the signal power levels must be divided approximately equally between the transistor pairs.

The output of the amplification stage 60 is provided over the line 134 to the lowpass filter 136 which is of conventional design adapted for suppressing harmonics. The lowpass filter 136 is selected so as to have negligible attenuation at 400 MHz, but to attenuate 450 MHz signals (the second harmonic of 225 MHz) and higher by approximately 60 dB. After passing through the lowpass filter 136, the output of the amplification stage 60 is supplied over the line 138 to the directional coupler and detector 38 which is similar in construction and operation to the directional coupler and detector 62 previously described. The directional coupler and detector 38 provides a signal on the line 142 which is an analog of the RF power output of the amplification stage 60 as sampled by the directional coupler and detector 38.

During both regular transmit and testing operations, the components 144, 146, 148 and 72 comprise an automatic gain control loop for generating the ALC signal based on the RF output of the power amplification stage 60 as indicated by the analog of this output level supplied by the directional coupler and detector 38. During transmit operations, the switch 146 is engaged in the OP position and directs the output of the summer 144 through the filter 148 which demodulates this signal so that only the carrier or average level is provided to the error amplifier 72. During testing operations, the switch 146 is engaged in the TE position, so that the filter is bypassed since the RF output of the amplification stage 60 is not in need of demodulation.

The level control module 156 provides a signal to the summer 144 which acts as a substitute for the RF output analog signal provided by the directional coupler and detector 38 under special conditions during the operation of the amplification system 50. Prior to receiving of normal drive levels from the transceiver 12 during regular transmit operations, as indicated by the signal provided by the directional coupler and detector 62 via line 64, the control logic 52 regulates the level control module 156 to provide a "precharge" signal to the summer 144. This signal overrides whatever signal may be provided by the directional coupler and detector 38 and helps adjust the overall power level of the amplification system 50 for more rapid response and minimum power overshoot when signals are initially received from the transceiver 12. During the first stage of testing operations, the level control module 156 is regulated by the control logic 52 to provide a "supercharge" signal to the summer 144. This signal overrides the RF output analog provided by the directional coupler and detector 38 in order to produce maximum attenuation by the variable attenuator 68 at the start of testing operations.

The reference voltage module 158 generates the reference voltage signal provided to the error amplifier 72 on the line 160 with which the RF output analog signal from the directional coupler and detector 38 is eventually compared by the error amplifier 72 in order to form the ALC control signal. The reference voltage module 158 is regulated by the control logic 52 to provide a slightly higher voltage signal level to the error amplifier 72 during testing operations so that the amplification system 50 is controlled to operate at peak power levels during testing operations, which are, nevertheless, short of significant gain compression due to saturation affects within the amplifier 102.

As previously discussed, the control logic 52 regulates the operation of the level control module 156, the switch 146, and the reference voltage module 158 as required for both regular transmit and testing operations, as well as controlling and setting of the bias voltage provided to the driver 100 and power amplifier 102. More specifically, the control logic 52 regulates the sequencing of testing operations as will be further described with respect to FIG. 5. The control logic 52 comprises a programmable logic array programmed for the required switching and logic operations in accordance with timing signals provided by the clock 164.

The fault detection module 66 includes a number of comparators arranged so as to be responsive to the ALC level on the line 74, the RF input analog signal level on line 64 and the RF output analog signal level on the line 152. Whenever the ALC signal level either exceeds a predetermined threshold or falls below a predetermined threshold, signals indicative of these events are provided to the control logic 52. Additionally, whenever the RF output power or RF input power exceed minimum power levels, signals indicative of these events are provided to the control logic 52. The control logic 52 monitors these signals during testing operations and provides a fault indication signal to the operator of transceiver 12, on line 162B if the signals from the fault detection module 66 do not assume appropriate values during specific phases of testing operations.

Figure 5:
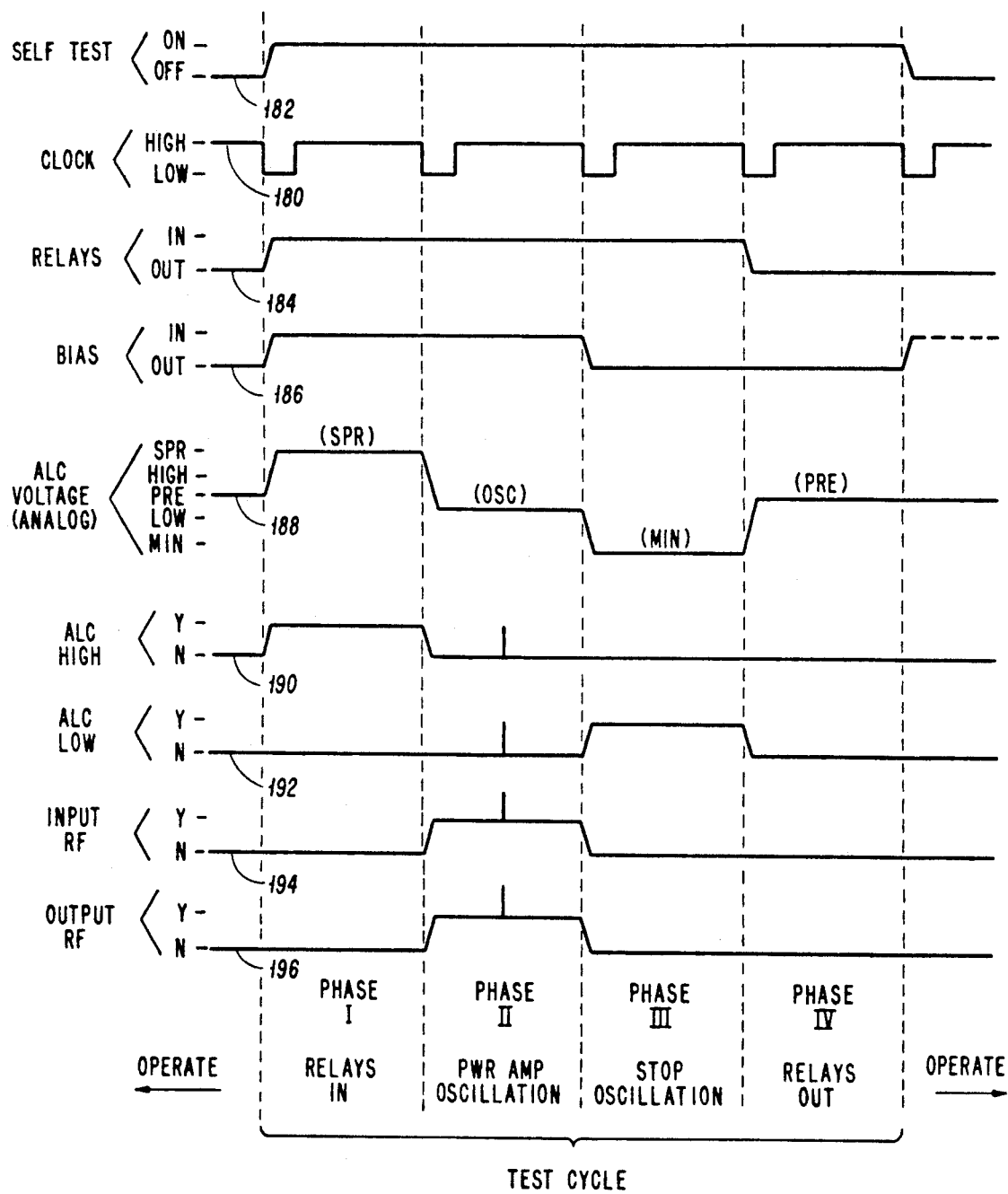
FIG. 5 provides a timing diagram illustrating the timing of a number of important signals generated within the test circuit and power amplification system shown in FIG. 2.

Referring now to FIG. 5, a timing diagram is shown illustrating that testing procedures are conducted in four separate phases as determined by the plot 180 of the timing signal from the clock 164. Phase 1 of test operations begins when the test initiation signal 182 on the self test line 162A assumes a logic high state. The control logic 52 responds to the logic high state of the test initiation 182 by starting the clock 164 which then provides the required timing signals for the operation of the control logic 52 and system 50. In phase I, the control logic 52 engages the relays 16 and 18 in the TE and TR positions as indicated by the plot 184 of the status of the relays and turns on the bias voltage to the driver 100 and amplifier 102 as indicated plot 186 of the status of the bias voltage. Additionally, the control logic 52 regulates the level control module 156 to furnish a high voltage level to the summer 144 which sets the corresponding ALC signal at supercharge level as indicated by the plot 188 of the ALC voltage. Since maximum attenuation is achieved by the variable attenuator 68 when the ALC signal is at the supercharge level, insufficient feedback is provided to the amplification stage 60 for oscillation to occur during phase I.

In phase II, the level control module 156 is regulated by the control logic 52 to provide zero voltage to the summer 144, thereby allowing the ALC control voltage to float dependent only on the levels of the RF output analog signal and test reference voltage supplied by the reference voltage module 158. The level of the ALC control signal rapidly decreases primarily in accordance with time constants associated with the PIN diodes 82 and 84 of the variable attenuator 68, until oscillation begins as the gain of the amplification stage 60 exceeds the losses determined by the load 34, filter 36 and attenuator 68 and sufficient RF output is generated to bring the RF output analog signal on line 142 up to the level of the test reference voltage signal on line 160.

The signals ALC high, ALC low, input RF and output RF shown by the plots 190, 192, 194 and 196, respectively, as provided by the fault detection module 66 to the control logic 52, furnish measures of the performance of the amplification system 50 which may be interpreted by the control logic 52 in accordance with the phase of the testing operation. The levels of the signals ALC high, ALC low, input RF and output RF are of greatest importance during phase II, since this is the phase in which the amplification system 50 is configured for oscillation at "peak" power levels characteristic of actual operating conditions for the system. The ALC voltage signal should stabilize at a level below the threshold for the ALC high signal to assume a logic high state and above the threshold for the ALC low signal to assume a logic high state, since the ALC voltage determines the attenuation of the attenuator 68 and the gain of the amplification stage 60 must equal the losses of components 34, 36 and 68. Further, input RF and output RF signals provided by the fault detector module 66 should assume the logic high state indicating that substantial amounts of RF power are being produced. The control logic 52 contains logic gate networks adapted for verifying that the ALC high, ALC low, input RF and output RF signals are at their proper logic levels in accordance with the phase of the testing operation and for providing a fault signal over the fault line 162B to the transceiver 12 when one or more of the signals are not at appropriate levels. By thus measuring gains at various power levels, amplifier linearity can be verified, in addition to its overall gain and power output capability.

In phase III, the bias voltage to the driver 100 and power amplifier 102 is turned off as indicated by the plot 186 and therefore, under normal conditions the oscillations will cease. The ALC voltage indicated by the plot 188 will decline to minimum levels due to lack of RF output. Finally, in phase IV, the relays 16 and 18 are disengaged from their test positions while the control logic 52 regulates the level control module to set the ALC signal at the precharge level in preparation for the performance of normal operation. At the end of phase IV, the system is prepared for normal transmit/receive operations.

Reviewing the overall operation of the amplification system 50, when the transceiver 12 calls for a test of the amplification system 50, the control logic 52 engages the relays 16 and 18 in their test positions allowing the system 50 to be configured in a feedback mode whereby the output of the amplification stage 60 is returned through the load 34 and bandpass filter 36 as its input. Meanwhile, the components of the automatic control loop are regulated by the control logic 52 to allow the amplification system 50 to oscillate at peak power levels approaching the maximum power required during normal operation short of gain compression. The performance of the amplification stage 60 is monitored by comparison of the control signal level and RF output signal level to predetermined thresholds. This allow a test of amplifier gain, power output and linearity. A fault status is indicated when the monitored signals fail to meet their required thresholds evidencing defective performance by the system 50 and particularly, the amplification stage 60. It should be noted that testing of the amplification stage 60 by configuring the system 50 in a feedback mode and regulating the amount of feedback through the use of an automatic gain control loop allows precise measurement of the performance of the system. For example, if only one of the transistor pairs in the power amplifier 102 were defective, the amplification system would ordinarily have adequate gain to start oscillating and achieve significant power output. However, the amplification system 50 would not be suitable for actual transmission operations since the required power output could only be achieved under conditions of substantial gain compression resulting in unacceptable amounts of distortion in the amplitude modulated output signal. The present invention detects this kind of defect by monitoring the ALC signal which would drop below normal levels, exceeding the threshold level for the ALC low signal to assume a logic high state, in order to compensate for the loss of a transistor pair.

While particular embodiments of the present invention have been shown and described, it should be clear that changes and modifications may be made to such embodiments without departing from the true scope and spirit of the invention. For example, the control logic 52 may be readily adapted to check logic levels of the signals provided by the fault detection module 66 during the other phases of testing operations (i.e., phases I, III and IV) in order to verify the functioning of the test and detection components of the system. It is intended that the appended claims cover all such changes and modifications.

I claim:

1. A test circuit for use in checking the operation of a power amplifier, comprising:
   relay means for switching said amplifier into a feedback mode in which the output of said amplifier is returned to its input;
   attenuator means for attenuating the output of said amplifier as it is fed back as input to said amplifier and dissipating the power generated by said amplifier;
   filter means for filtering the output of said amplifier to pass only a narrow band of frequencies before said output is fed back as input to said amplifier; and
   comparison means for checking the power level of the output of said amplifier.

2. The test circuit of claim 1, further including a plurality of 90° quadrature couplers for splitting the input to and recombining the output from said amplifier.

3. The test circuit of claim 1, wherein said attenuator means provides a variable amount of attenuation in response to an error signal generated by comparing the output of said amplifier to a reference signal.

4. The test circuit of claim 2, wherein said amplifier comprises a plurality of transistor pairs connected in push-pull configurations for A-B Class amplification operations.

5. The test circuit of claim 1, wherein said filter means comprises a two pole capacitively top coupled filter.

6. A method for testing a power amplification stage in an electronic device, comprising the steps of:
   configuring said amplification stage in a feedback mode wherein the output of said amplification stage is returned to its primary high frequency input as feedback so as to drive said amplification stage;
   regulating the amount of said feedback provided to said primary high frequency input in order to control said amplification stage for operation at peak power levels; and
   comparing the amount of feedback provided to said primary high frequency input required to achieve operation of said amplification stage at peak power levels to a predetermined standard in order to verify the proper operation of the amplification stage.

7. The process of claim 6, further including the step of splitting the input to and recombining the output from said amplification stage using a plurality of 90° quadrature couplers.

8. The process of claim 6, wherein said amplification stage comprises a plurality of transistor pairs connected in push-pull configurations for Class A-B amplification operations.

9. The process of claim 6, wherein said step of regulating the amount of said feedback includes the substeps of generating a control signal by comparing the output power level of the amplification stage to a reference level and attenuating said feedback in response to said control signal 1.

10. The process of claim 9, wherein said step of comparing the amount of feedback required for peak power level operation includes the step of comparing said control signal to a reference signal.

11. The process of claim 6, further including the step of filtering the output of said amplification stage in order to pass only a narrow band of frequencies.

12. A built-in test circuit for use in testing a power amplification stage in a radio transmitter, comprising:
    switching means for configuring said amplification stage in a feedback mode wherein its output is returned to its input;
    variable attenuator means for attenuating the output of said amplification stage as it is fed back to its input in response to a control signal;
    control means for generating said control signal by comparing the power level of the output of said amplification stage to a reference level; and
    comparator means for verifying that the output of said amplification stage is varying within prescribed limits by checking the level of said control signal.

13. The test circuit of claim 12, further including filter means for filtering the output of said amplification stage before it is fed back to its input in order to pass only a narrow band of frequencies.

14. The test circuit of claim 12, further including a plurality of 90° quadrature couplers for splitting the input to said amplification stage and recombining the output from said amplification stage.

15. The test circuit of claim 14, wherein said amplification stage includes a plurality of transistor pairs connected in push-pull configurations adapted for A-B Class amplification operations.

16. The test circuit of claim 12, wherein said attenuator means comprises a quadrature hybrid pin diode attenuator.

17. The test circuit configuration of claim 12, wherein said amplification stage further includes a driver stage for preamplifying the signal supplied to said amplification stage.

18. The test circuit of claim 12, further including a fixed attenuator means for dissipating the power generated by said amplification stage.

* * * * *